United States Patent [19]

Bennion

[11] Patent Number: 4,774,434

[45] Date of Patent: Sep. 27, 1988

[54] LIGHTED DISPLAY INCLUDING LED'S MOUNTED ON A FLEXIBLE CIRCUIT BOARD

[75] Inventor: Don U. Bennion, West Valley City, Utah

[73] Assignee: Innovative Products, Inc., Salt Lake City, Utah

[21] Appl. No.: 896,052

[22] Filed: Aug. 13, 1986

[51] Int. Cl.⁴ .................... H01L 23/12; H01L 23/28; H01L 33/00
[52] U.S. Cl. ................................... 313/500; 313/511; 313/512; 340/825.82; 340/815.15; 340/815.03
[58] Field of Search ...................... 313/500, 511, 512; 339/17 F; 340/825.82, 815.03, 815.06, 815.07, 815.15, 815.16, 815.17; 357/72

[56] References Cited

U.S. PATENT DOCUMENTS

| | | | |
|---|---|---|---|
| 4,024,627 | 5/1977 | Stauffer | 313/500 X |
| 4,241,277 | 12/1980 | Hintze et al. | 313/500 |
| 4,603,496 | 8/1986 | Latz et al. | 313/500 X |

Primary Examiner—David K. Moore
Assistant Examiner—K. Wieder
Attorney, Agent, or Firm—Robert R. Mallinckrodt; Philip A. Mallinckrodt

[57] ABSTRACT

An LED display particularly adapted to be used as part of a design on articles of clothing such as tee-shirts, includes a flexible circuit board to which individual LED dies are secured in desired position. The individual dies are electrically connected to traces on the circuit board and are encapsulated on the board so as to protect the individual dies and connections and so that the encapsulating material forms lenses for the dies. In most instances, the display so formed will be completely covered with a protective layer of covering material having a design thereon and having transparent or translucent means over the encapsulated LED dies so that light given off by the LEDs is transmitted through the layer. Control circuitry is provided to supply power to the LEDs, preferably in a predetermined pattern, to cause them to illuminate.

19 Claims, 5 Drawing Sheets

LIGHTED DISPLAY INCLUDING LED'S MOUNTED ON A FLEXIBLE CIRCUIT BOARD

BACKGROUND OF THE INVENTION

1. Field

The invention is in the field of light displays wherein a plurality of individual light sources are activated in a random or preset pattern, and particularly applies to light displays adapted to be included on articles of clothing.

2. State Of The Art

While entertainers have utilized various lighted costumes in the past, lighted clothing has not been available for use by the general public until recently. These recent items of clothing have taken the form of tee-shirts wherein one or more light emitting diodes (LEDs) are incorporated into the shirt, usually as part of a design. For example, the shirt may have a design of an animal with lights that blink on and off for the eyes, or may have a design of a car with lights which blink on and off as the headlights. There are also hats available which have blinking lights thereon.

In such items of clothing, the LEDs or other light sources are either hard wired onto the item with the wire running to drive circuitry and a power supply, or are inserted into sockets that are hard wired to the item. In cases where circuit boards are used, the boards are stiff and either permanently adhered to the clothing item or removeably adhered such as with Velcro. In all cases, the wires, sockets, LEDs, or circuit boards make the item difficult to wash and generally uncomfortable to wear, particularly where stiff circuit boards are used.

SUMMARY OF THE INVENTION

According to the invention, a light display which is particularly adapted for use on items of clothing includes a flexible circuit board having a plurality of conductive paths thereon. The flexible circuit board may be made of a one mil thick mylar substrate material with one ounce copper foil traces as conducive paths thereon, and may be made in customary manner for making printed circuit boards. Individual LED dies, either as individual dies or individually mounted on additional substrates, are secured to the circuit board and conductively connected to appropriate conductive paths thereon so that power to cause the LEDs to light may be supplied through such conductive paths. The LED dies are encapsulated on the circuit board to provide both physical protection to the dies and their electrical connections and to act as lenses to concentrate the light emitted.

An electronic control circuit is provided to supply power to the conductive paths on the circuit board to thereby light selected LEDs which may be lighted in a random pattern, but preferably in a predetermined pattern. A power supply, such as a battery, is connected through connecting means to provide power to the control means.

When used in connection with clothing, such as tee-shirts, it is preferred that a covering material, such as a vinyl, be bonded to the face of the circuit to thereby cover and waterproof the circuit. The covering material is provided with transparent or translucent portions adapted to cover the encapsulated LEDs, so that light from the LEDs pass therethrough. In most instances the covering material will have a design thereon and the design and light display will form a single integrated display.

Although various control circuits can be used, it is preferred that the control circuitry of the invention be programmable, easily turned on and off, and have relativly low power consumption.

The display of the invention may be easily applied to tee-shirts and other items of clothing and, because it is flexible, is comfortable to wear and, because it is waterproof, may be easily washed.

DRAWINGS

In the accompanying drawings, which illustrate the best mode presently contemplated of carrying out the invention in actual practice.

DETAILED DESCRIPTION OF THE ILLUSTRATED EMBODIMENT

Figure 1:
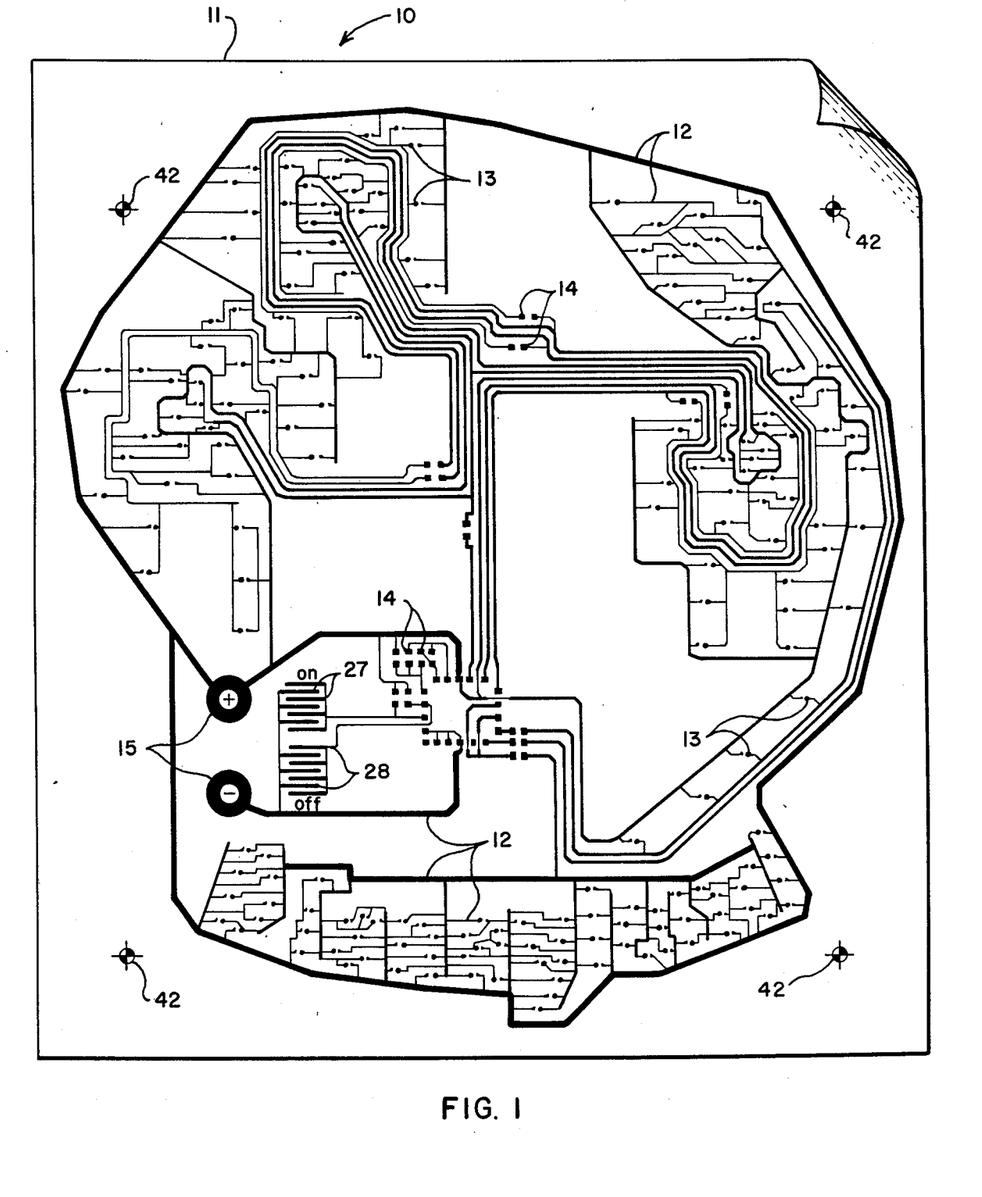
FIG. 1 is a schematic representation of a flexible printed circuit board of the invention wherein the lines, other than the outline of the board, represent the conductive paths or traces on the board.

Referring to FIG. 1, a flexible printed circuit board 10 is formed of a flexible substrate 11 having conductive paths 12 thereon. The substrate may be various types of flexible material with one mil thick mylar having been found satisfactory. Initially, substrate material has one side thereof coated with a conductive material. In making the circuit board, the conductive material is covered with a photoresist material and the desired pattern is then exposed onto the photoresist covered conductive material in standard manner for the production of printed circuit boards. The conductive material is then etched away in standard fashion to leave only the desired conductive paths or traces as shown by the lines and dark areas in FIG. 1. This is a standard printed circuit board manufacturing process and does not form part of the invention. Further, any known type of printed circuit board manufacturing process could be used to form the basic circuit board of FIG. 1. The important thing is that the finished board be flexible and that it have the desired conductive paths secured thereon.

It has been found that with the flexible mylar substrate, a one ounce copper foil bonded to the mylar is satisfactory to form the desired conductive paths or traces 12 and still maintain the flexibility of the circuit board. Further, the one ounce copper traces are sufficiently durable to maintain conductive integrity with continued back and forth flexing of the circuit board as will occur with normal wear and handling of an article clothing such as a tee-shirt.

Some of the conductive paths 12 of the circuit board 10 are provided with enlarged pads 13 of conductive material at locations where light emitting diode (LED) dies are to be placed. Enlarged conductive pads 14 are provided where packaged integrated circuits or other components are to be connected to the board, and enlarged pads 15 are provided where leads from the power source, such as a battery, are to be connected to the board.

Figure 7:
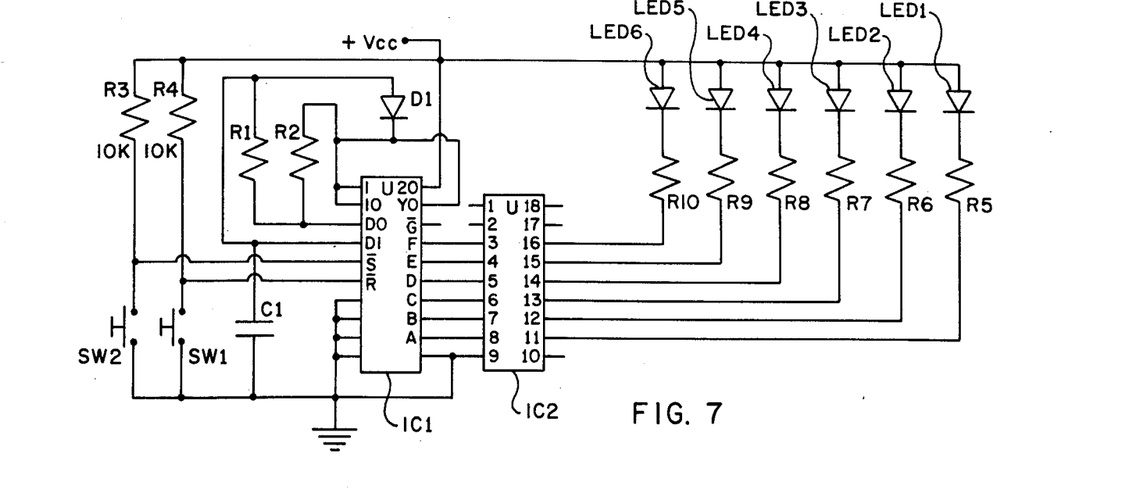
FIG. 7, a circuit diagram of an example of circuitry that can be used with the display to produce a predetermined display pattern.

As will be noted if the various traces are followed, each trace 12 having one or more enlarged pads 13 thereon for mounting of an LED die extends to a pad 14 adapted for connection to an integrated circuit component of the circuit and the integrated circuit, in turn, as will be explained in connection with FIG. 7, is connected to the pad 15 indicated as negative (—). Adjacent to each pad 13 is another trace 12 which is connected directly to the pad 15 indicated as positive (+).

Figure 2:
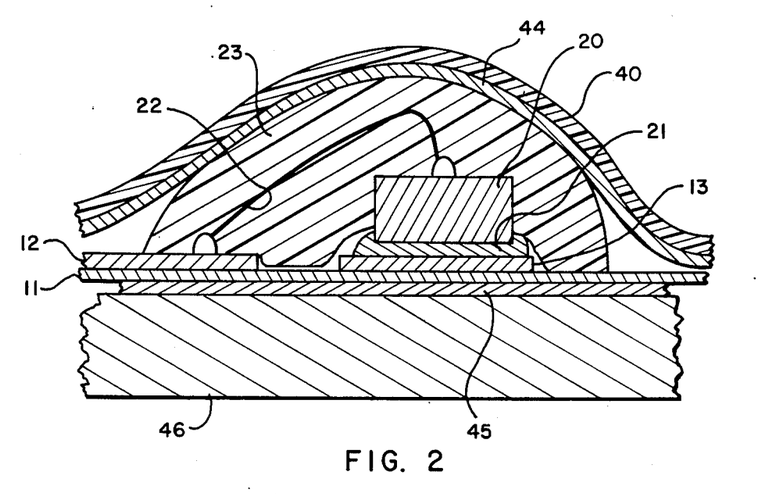
FIG. 2, a fragmentary vertical section taken through one of the LED dies as mounted on a printed circuit board and as part of a finished display, showing a covering material as part of the display and showing the display on a tee shirt, some of the layers being shown in exagerated proportions.

With the circuit board of the invention, and in one embodiment thereof, individual LED dies are mounted directly on the board. FIG. 2 shows a vertical section taken through a finished display of the invention and showing a pad 13 and adjacent opposite polarity trace indicated as 12. As shown, an LED die 20 is secured to the conductive pad 13 with a conductive epoxy material 21, such as silver conductive adhesive type X-A-1 manufactured by Sheldahl Inc. of Northfield, Minn. The back of the die where secured to pad 13 forms one electrical contact for the die. With the die 20 electrically conductively secured to conductive pad 13, the top of the die, which forms the other electrical contact for the die, is elecrrically connected to conductive material 12 by wire lead 22, such as an aluminum or gold wire which is secured to the die and the conductive material of the board by connection means such as aluminum wedge bonding or gold ball bonding. The individual LED dies are available from various LED manufacturers. Those identified by part nos. 02-ES2A, -RG1A,-GS3A, -EG1A, and -YS3A and made by Lite-On Corporation, Dallas, Tex., have been found satisfactory.

In the manufacture of the display, preferably the conductive epoxy is applied to the various locations where the LEDs are to be attached. Then the individual LED dies are placed on the conductive epoxy with automated pick and place equipment, such as made by Universal Instruments Corp., Denver, Colo. The epoxy is allowed to cure and, if cured in an IR oven in which the epoxy is brought to a temperature in excess of 300° F., the cure is completed in about one minute. An IR oven is preferred, because the mylar is substantially transparent to the IR radiation so does not itself heat up substantially. The IR radiation comes from the bottom of the board and passes through the mylar and is absorbed by the copper traces on the board, which heat up. The heat is transferred to the epoxy by conduction from the copper. While the copper heats up, it has been found that in the IR oven the mylar does not melt even where against the copper traces.

After the epoxy has cured, the leads 22 between the die and conductive traces on the board are connected using standard aluminum bonding techniques and equipment or other known techniques and equipment. The flexible circuit board is held flat and secure during this bonding process through the use of the normal vacuum platen and vacuum system, which is part of the usual wedge bonding equipment. However, the normal vacuum holes in the vacuum platen supplied with the equipment are preferably filled with sintered metal plugs, so that the flexible board is not drawn down into the vacuum holes but remains flat over the surface of the vacuum platen. Since the circuit boards of the invention on which the wire bonding is needed will generally be much larger than hybrid circuit substrates or integrated circuit packages where wire bonding is usually performed, the vacuum platen used will be usually be one of the larger optional platens available with the equipment or may have to be specially supplied in a larger than generally available size.

Once the LED dies are mounted on the circuit board and the connections made, the die and wire bond assemblies are encapsulated to provide physical protection for the assemblies and to form an optical lens for each of the LEDs, which serves to intensify the light from the LED in the same manner that the lens intesifies the light emitted from a prepackaged LED. Although various materials could be used to encapsulate the LED dies, an ultraviolet, curable, encapsulation compound of grade UV15X-2 made by Master Bond Inc. of Englewood, N.J., has been found satisfactory. Such encapsulating material has been found to cure upon exposure to ultraviolet light in a matter of several seconds, without causing any damage to the mylar substrate.

As shown in FIG. 2, the encapsulating material 23 is placed over each individual LED die so as to completely cover the die and wire connection, and is then allowed to cure to form the protective cover for the die as shown.

At some convenient time in the assembly up to this point, the integrated circuits and other components used in the driving circuitry are attached to the circuit board. Preferably, these components are supplied in either the standard surface mount packages or in special packages, either of which are mounted on the circuit board conductive pads 14 with conductive epoxy similar to that used to secure the LED dies to the circuit board, Thus, it is convenient to mount these components at the same time the LED dies are mounted. After the epoxy cures, these components may be potted or encapsulated as are the LED dies to further secure them to the circuit board.

Figure 3:
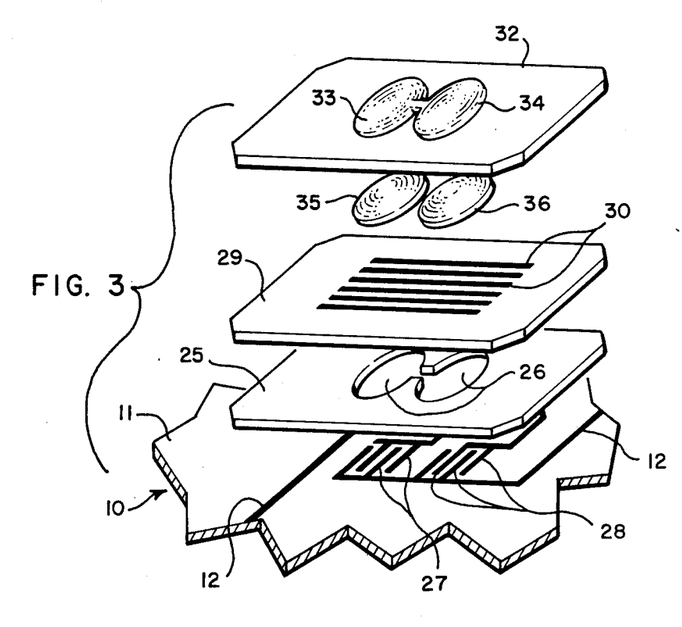
FIG. 3, a fragmentary exploded view of a membrane switch used with the invention and mounted on the printed circuit board of FIG. 1.

As shown in FIG. 3, an on-off switch is constructed on the circuit board by securing an insulating material 25, with opening 26 therein, over conductive paths 27 and 28 on circuit board 10, FIGS. 1 and 3, which are labeled "ON" and "OFF", respectively. This insulating layer may conveniently be a piece of 0.005 inch thich mylar with 0.4 inch diameter holes interconnected to form hole 26. On top of insulating layer 25 is secured a further insulating layer 29, which has bars 30 of conductive material overlying and at transverse orientation to circuit board traces 27 and 28. The conductive bars 30 are located on the bottom side of layer 29 (layer 29 here being transparent so that bars 30 show through the top surface) and are formed of electrically conductive material, such as electrically conductive ink, so that, when the bars 30 are pressed against bars 27, they form a conductive path between the separated bars 27. Similarly, when bars 30 are pressed against bars 28, they form a conductive path between the separated bars 28. A third layer of material 32 is secured over layer 29 and has interconnected, raised, dome portion 33 and 34 formed therein to hold the material of layer 32 away from layer 29 over bars 30. Metal clickers 35 and 36 may also be provided between layers 29 and 32 to give a positive feel when one or the other of domes 33 or 34 is depressed. Layer 25 is secured to circuit board 10 and layers 25, 29, and 32 are secured together by any suitable adhesive, such as a pressure sensitive adhesive. Layers 29 and 32 may also be formed of 0.005 inch thick mylar.

To operate the switch, one of the domes, for example dome 33, is depressed, which causes bars 30 on layer 29 to come into contact against and electrically connect together bars 27 of the circuit board. Bars 30 are normally held separated from bars 27 by spacer layer 25. Upon release of pressure from dome 33, the dome resumes its dome shape releasing pressure on layer 29 in the area of bars 30 allowing layer 29 to move to its normal position in which it is separated from circuit board 10. In like manner, if dome 34 is depressed, it causes bars 30 to contact and electrically connect together bars 28 on circuit board 10. These switches are shown as push-to-close switches in the circuit diagram of FIG. 7.

Figures 5, 5A, 6:
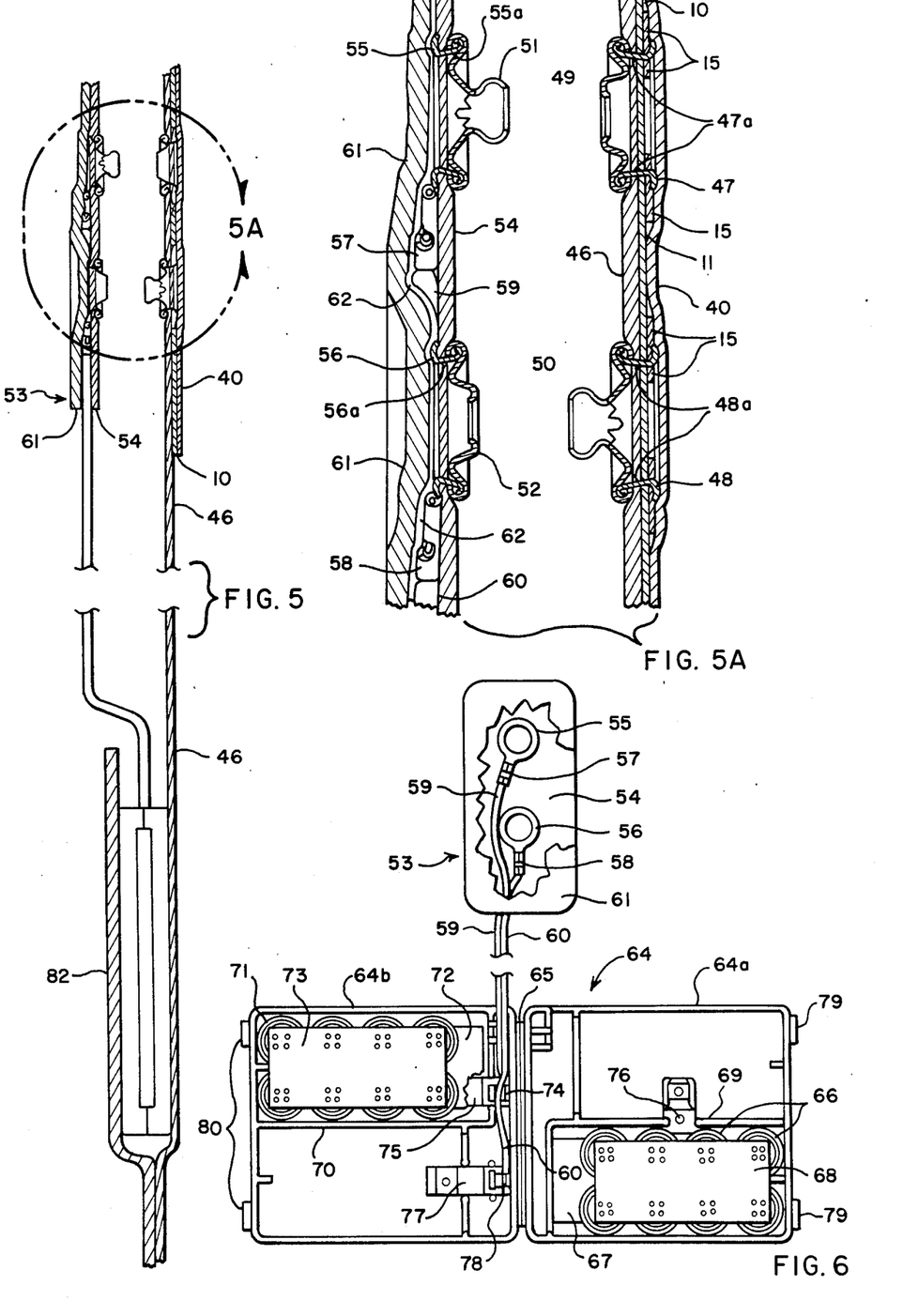
FIG. 5, a fragmentary vertical section taken through a finished display and similar to FIG. 2, but taken through the display at the location of the power supply pads on the circuit board rather than through an LED die, and showing the power supply connections.
FIG. 5A, an enlargement of the portion of FIG. 5 enclosed by line 5A showing the details of a snap-terminal arrangement for the invention.
FIG. 6, a front plan view of the power supply as shown in FIG. 5.

Pads 15 on the circuit board provide a means for connecting a power supply to the display to supply power thereto. Generally, wires or terminals will be connected to pads 15 and to a power supply such as the terminals of a battery holder, which will separate from the display and connected only through these wires or terminals. A specific embodiment of battery holder and connections to pads 15 for use with a tee-shirt are shown in FIG. 5 and will be described later.

The display of the invention is now essentially complete and may be used in applications where it is not required that the display be waterproof or otherwise have a protective layer of covering material thereover.

In most instances, however, such as when the display is used on clothing, it will be desirable to waterproof the display and otherwise provide a protective layer or covering over the circuit board and display as described so far. Further, when the display is used as part of an artistic design, as will normally be the case, the covering material will provide the printed artistic design of which the LED display becomes a part.

Figure 4:
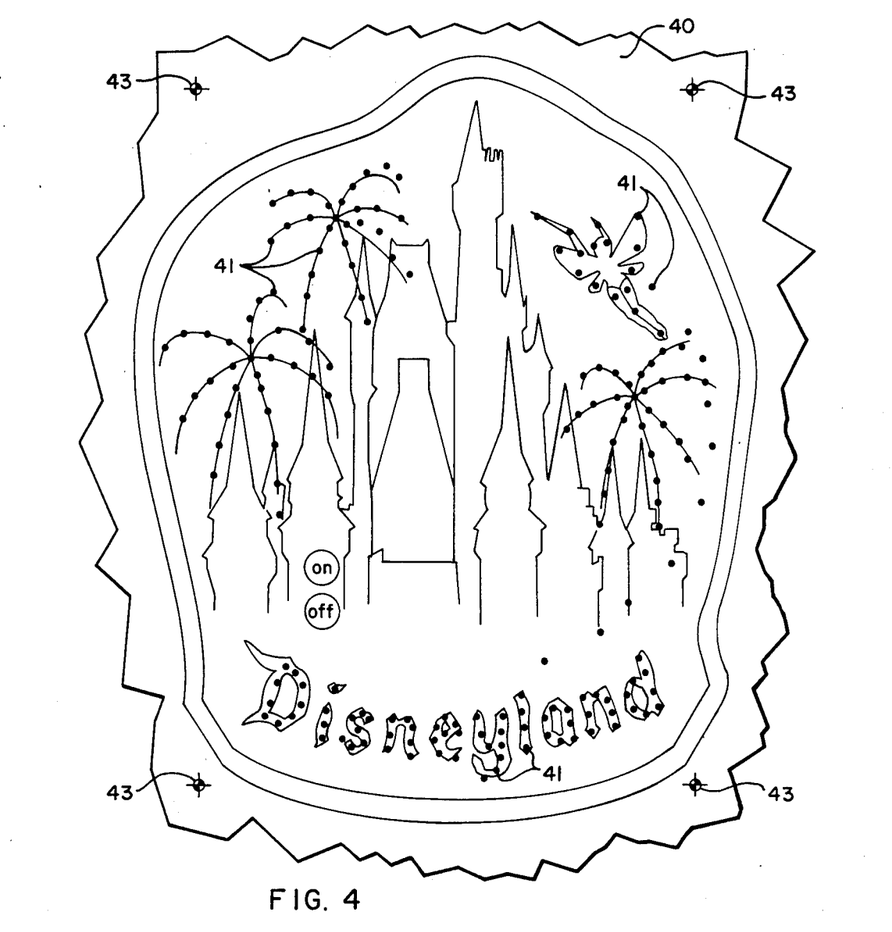
FIG. 4, a schematic representation of the covering material adapted to be secured over the circuit board of FIG. 1 and having an artistic design thereon that forms part of the display of the invention.

In the illustrated embodiment of the invention, the LED display is adapted for use as part of a Disneyland picture and display. FIG. 4 shows a schematic representation of a Disneyland picture as applied to the LED display of FIG. 1. The covering material 40, which provides a protective and waterproofing layer for the display, is a clear, flexible material, such as a clear vinyl. The desired art work, if any, such as the Disneyland picture shown in FIG. 4, is printed by applying ink to the back side of the vinyl. This is done in normal manner as in the making of normal heat transfer designs for clothing. In this case, however, the design has small transparent or translucent areas 41, usually at least about fifty mils in diameter, which register with the encapsulated LEDs on the display and allow the light from the LEDs to shine through the design. Registration of the design and the circuit board may be accomplished by incorporating registration targets 42, FIG. 1, on the printed circuit board and registration targets 43, FIG. 4, on the design. By aligning the targets 43 on the design over targets 42 on the printed circuit board, registeration of the transparent or translucent areas of the design and the LEDs of the display may be easily achieved.

The design is bonded to the basic display by bonding it to the foil side of the circuit board 10 over the LEDs and other circuit components on the board. This may be easily done by placing a layer of heat sensitive adhesive 44, supplied in the form of a sheet, such as a type T-100 thermally activated adhesive made by Sheldahl Inc., over the circuit board and components thereon. This adhesive has a melting temperature of between 280° and 340° F. The sheet of covering material is placed over the adhesive and aligned with the circuit board. The bonding of the covering material to the display is accomplished in a standard heat transfer press, such as a Model 100 manufactured by Midwest Lettering Inc. This press has a platen, which is set at about 300° F. and a pressure of between 1 and 4 PSI. The press melts the adhesive layer 44 sandwiched between the covering material 44 and the mylar circuit board, causing the two to be securely joined and to provide a water tight seal for the circuitry of the display. As shown in FIG. 2, after bonding, the covering material 40 extends completely over the top surface of the encapsulated LED dies. It has been found that, even at the 300° F. of the press, the mylar circuit board, because it is in a press, will retain its shape and integrity. As shown in FIGS. 1 and 4, the circuit board 10 and the covering material 40 extend beyond the circuit traces and artistic design. After alignment and bonding of the covering material to the display board, the excess material around the edges of the design, including the area where targets 43 are located, is preferably cut or trimmed from the display.

This completed display may now be attached to an item of clothing, such as a tee-shirt, or may be used in some other manner. For attachment to a tee-shirt, a layer of temperature sensitive adhesive 45, such as the same type of adhesive used to bond the vinyl layer to the circuit board, is placed between the underside of the display and a shirt 46. The display and shirt are placed in a heat transfer press, so that the adhesive melts and bonds the display to the shirt. The display is thus mounted on shirt 46 as shown in FIG. 2.

When used on a shirt or other item of clothing, the connection of pads 15 of the circuit board to a battery holder may be conveniently made through use of ordinary clothing snaps. Referring to FIG. 5, a display mounted on a shirt as shown in FIG. 2 has the display made up of circuit board mylar 11 with terminal pads 15 thereon and covering material 40 providing a protective layer thereover. Prior to securing the covering material 40 over the circuit board, male snap fastener halves 47 and 48 are mounted over pads 15 by pushing the pronged ends 47a and 48a through the mylar of the circuit board, so that snap half 47 conductively rests against one pad 15, with prongs 47a extending through the mylar, and snap half 48 conductively rests against the other pad 15, with prongs 48a also extending through the mylar. Generally, the prongs will extend through the mylar and pad 15 where there is conductive material, as shown in FIG. 1, with the outer portion of the snap halves resting against the conductive material of the pads. The covering material 40 is then applied over the circuit board to form the display as previously indicated.

When the display is mounted on a shirt or other item of clothing, the snap prongs 47a and 48a puncture the shirt material and extend through the other side of the material. At this time, the female snap halves 49 and 50 are mounted in normal manner on snap halves 47 and 48 by squeezing the halves together to bend the prongs outwardly within the receiving halves to thereby hold the halves together. It should be noted that, while both halves 49 and 50 have been indicated as female snap halves because they receive prongs 47a and 48a, snap half 49 forms a female snap and snap half 50 forms a male snap.

Female snap 49 is adapted to mate with a mating power supply male snap 51, and male snap 50 is adapted to mate with a mating power supply snap 52. Power supply snaps 51 and 52 are mounted on a terminal pad 53, which is made up of a sheet of material 54, such as heavy cloth or vinyl, to which power supply snaps 51 and 52 are secured by male snap halves 55 and 56, which have prongs 55a and 56a, respectively, extending through material 54 to hold snap halves 51 and 52 secured to material 54. Male snap halves 55 and 56 are formed with electrical terminals 57 and 58 to receive wires 59 and 60 crimp-connected or soldered thereto. A piece of heavy cloth or vinyl material 61 is secured to material 54 over the snap halves and wires by a layer of adhesive 62 to form the back of pad 53.

A battery holder 64 is formed with holder halves 64a and 64b hinged together by flexible plastic web 65 formed integrally with halves 64a and 64b. The lower portion of holder half 64a, as it appears in FIG. 6, holds eight small batteries 66, such as type A76 standard 1.5 volt calculator batteries connected together in electrical parallel by conductive plates 67 and 68. The battery assembly is held in place in half 64a by walls 69 formed integrally with half 64a. The upper portion of holder half 64b, defined by walls 70 that are formed integrally with holder half 64b, holds an additional eight batteries 71 similar to batteries 66. Again, batteries 71 are connected in electrical parallel by conductive plates 72 and 73.

Wire 59 from terminal pad 53 has a clip 74 secured to its end within battery holder 64, a portion 75 thereof being held in electrical contact with plate 72 when the battery assembly is in place. A terminal 76 in holder half 64a contacts two of the batteries 66 in a position which electrically connects it to plate 67 and is adapted to contact plate 73 of batteries 71 when the two halves of the battery holder are closed, so as to connect the two sets of batteries in electrical series. Terminal 77, mounted in holder half 64b, is connected through clip portion 78 to the end of wire 60 and is adapted to contact plate 68 when the battery holder is closed to thereby complete the connection of the batteries to terminal pad 53. When closed, tab 79 and mating holder 80 hold the halves 64a and 64b in closed condition. When closed, each parallel connected pack of eight batteries is connected in series to provide three volts across the terminals of the battery holder. Each parallel connection of batteries is removable upon opening of the battery holder, so may be easily replaced.

In use, snaps 51 and 52 of terminal pad 53, connected to battery pack 64 by wires 59 and 60, are snapped onto mating snaps 49 and 50, respectively, of the display. In this way, power is provided to the display. The battery pack 64 may easily be carried in a pocket formed by material 82 sewn or bonded inside shirt 46. When it is desired to wash the shirt or otherwise disconnect the battery holder from the display and remove it, terminal pad 53 is simply unsnapped from the display snaps and battery holder 64 is removed from the pocket.

Typical circuitry for embodiments of the invention is shown in FIG. 7. This is an example of specific circuitry which may be used with the invention. As shown, the circuitry includes a CMOS zero current hard array logic (ZHAL) integrated circuit device IC1, such as a 16RP7 made by Monolithic Memories Incorporated of Santa Clara, Calif., and a driver integrated circuit IC2, such as a ULN 2801A made by Sprague Electric Company of Concord, N.H.

The IC1 will be programmed during manufacture of the integrated circuit with a program supplied by the display designer. The IC1 has a series of internal D type flip-flops, which produce the output signals. One of the IC1 input/outputs is connected to form an internal clock for the device. This is done through the connection of diode D1 and resistors R1 and R2 between the terminals of The IC1, here labeled as YO, DO, and DI, and through the connection of capacitor C1 between the terminal labeled DI and ground. The frequency of the clock is established by the value of these components. If the frequency of the clock is kept below 100 Hz, the quiescent operating current and thus the current drain on the battery is in the range of about 600 microamperes.

While the display can be turned on and off in various ways for use with a tee-shirt and with the push-to-close "on" and "off" switches, shown in FIG. 3 and indicated by reference numbers SW1 and SW2, respectively, FIG. 7, it is preferred to use one of the interal flip flops to set the circuit to either an "on" condition or an "off" condition. With the positive terminal of the power supply connected to the circuitry at the terminal labeled +Vcc and the negative terminal of the power supply connected to ground, the internal clock of the IC1 will operate on a continuous basis. With the flip-flop set to its "off" state, only the clock operates. In "off" condition, the flip-flop is set so that the G output internally of the device is high and the /G("not" G) output, therefore, is low. The various outputs of the IC1 chip may be used internally through programming of the chip.

Figure 8:
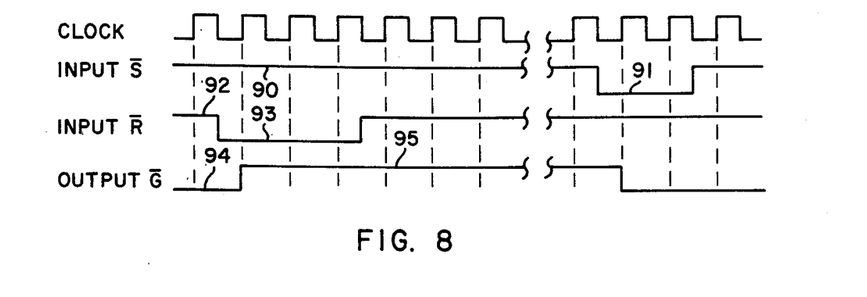
FIG. 8, a timing diagram of the operation of the on-off circuity as used in the circuitry of FIG. 7.
Figure 9:
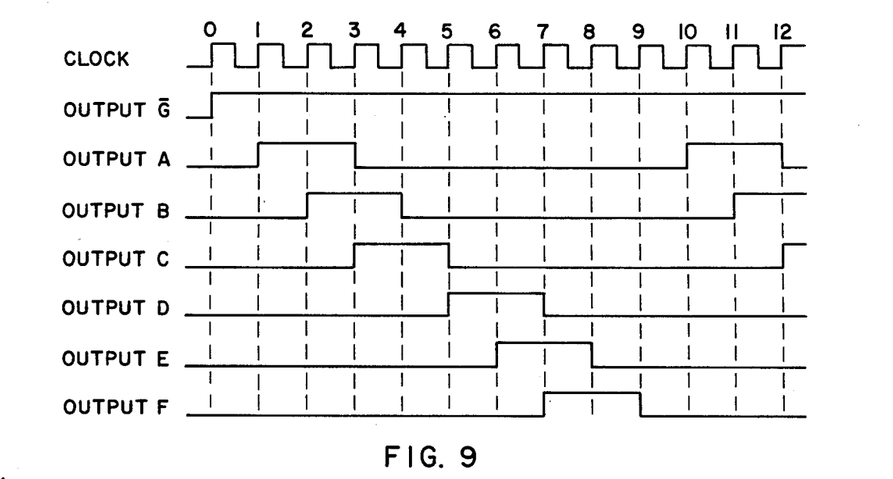
FIG. 9, a timing diagram of the circuitry shown in FIG. 5.

Normally, both the /S and /R inputs to the IC1 are held high by +Vcc connected through R3 and R4, respectively, to such inputs. When it is desired to activate the circuit, switch SW1, the "on" switch, is depressed, thereby grounding the /R terminal of the IC1 and causing the flip-flop to change states, so that the G output goes low and the /G output goes high. The device is programmed so that the flip-flop remains in this "on" state until the "off" button, SW2, is depressed to ground the /S input to the flip-flop, causing the flip-flop to again change state back to its "off" condition. The operation of the on-off circuitry is shown by the timing diagram of FIG. 8. The top line in FIG. 8 represents the internal clock pulses of the IC1. The second line represents the input on the /S input of the IC1, which, as shown at 90, is normally high with SW2, FIG. 5, open but goes low, to produce a negative going pulse 91, when SW2 is closed. The third line represents the input on the /R input of the IC1, which, as shown at 92, is also normally high with SW1 open but goes low to produce a negative-going pulse 93 when SW1 is closed. The last line of FIG. 8 represents the /G output of the flip-flop. As indicated above, a low output, 94, on /G indicates the "off" condition of the circuitry and a high output, 95, indicates the "on" condition. The diagram starts at the left-hand side, with the circuitry in an "off" condition, i.e. with output /G low. When the "on" switch, SW1, is depressed to activate the circuitry, negative-going pulse 93 appears on the /R input. At the next positive-going clock pulse, the flip-flop changes state so that the output /G changes to a high output, indicated at 95. The high output remains even after release of switch SW1, and the circuitry remains "on" until "off" switch, SW2, is depressed to cause the input on /S to go low. At the leading edge of the next-positive-going clock pulse after input /S goes low, the output /G goes low, thereby putting the circuitry in its "off" condition.

The IC1 may be programmed to operate the display in any desired manner. Outputs of IC1 are connected to inputs of driver circuitry IC2 so that an output signal from IC1 on an input of IC2 causes IC2 to complete the circuit from +Vcc through the appropriate LED and appropriate resistor and then through IC2 to ground. The specific IC2 mentioned above provides an open collector darlington output and provides either an open connection or a grounded connection as the output. The IC1 may be programmed to produce up to six outputs and in any desired combination to operate the LEDs of the display.

In the embodiment shown, which provides the Disneyland display as shown in FIG. 4, the IC1 is programmed to cause separate illumination of six individual groups of LEDs. The first group consists of twelve individual red LEDs located in the center of the firework bursts shown in FIG. 4. This group is lighted first. While the first group is lighted, the second group, consisting of thirty-six orange LEDs in the mid sections of the firework bursts, is illuminated. With the second group illuminated, the first group of LEDs is turned off while a third group of forty-three yellow LEDs at the outside of the firework bursts is illuminated. The middle group of LEDs go out and then the third group goes out. The word "Disneyland" at the bottom of the display is then illuminated by the fourth group of LEDs numbering seventy individual LEDs. While the word "Disneyland" is illuminated, the fifth group of eleven LEDs located in Tinkerbell's trail are illuminated. The word "Disneyland" goes out and, while the fifth group remains illuminated, the sixth group, consisting of sixteen LEDs making up Tinkerbell, is illuminated. The trail goes out and then Tinkerbell goes out and the whole sequence begins over again.

The boolean equations which define the various connections in the programmable array logic chip are:

```
A      :=/A*/B*/C*/D*/E*/F*/G       ; CENTERBURST
       +A*/B*/C*/D*/E*/F*/G
A.CLKF = CLK
B      :=A*/B*/C*/D*/E*/F*/G        ; BURST NO. 2
       + A*B*/C*/D*/E*/F*/G
B.CLKF = CLK
C      :=A*B*/C*/D*/E*/F*/G         ; BURST NO. 3
       + /A*B*/C*/D*/E*/F*/G
C.CLKF = CLK
D      :=/A*B*C*/D*/E*/F*/G         ; DISNEYLAND
       + /A*/B*C*/D*/E*/F*/G
```

-continued
```
D.CLKF = CLK
E      :=/A*/B*/C*D*/E*/F*/G        ; TRAIL
       + /A*/B*/C*D*E*/F*/G
E.CLKF = CLK
F      :=/A*/B*/C*D*E*/F*/G         ; TINKER BELL
       + /A*/B*/C*/D*E*F*/G
F.CLKF = CLK
G      :=S*/G + /R*G
G.CLKF = CLK
/H     = CLK
```

The (/) represents a "not", the (*) and "and", and the (+) an "or". The (:) indicates that a flip-flop is producing the output. Thus, IC1 is programmed so that a high output is produced on output terminal A when "not" A is high, meaning that A is low, and when simultaneously B, C, D, E, F, and G are all also low or when A is high and B, C, D, E, F, and G are low. In "off" condition, G is high, so no output occurs on A or on any of the other outputs, which all require G to below, /G to be high, in orderfor an output to occur. When the circuit is turned "on", so that G goes low, i.e. /G goes high, the first term of the A output equation is satisfied and an output is produced as output A. With the output A, the first term of the equation is no longer satisfied, but the second term, requiring an output on A but no outputs on B, C, D, E, F, and G, is satisfied. The output of IC1 can change only on the positive-going clock pulse after an equation term has been satisfied. Thus, in FIG. 6, the circuit was turned "on" at the leading edge of clock pulse 0, i.e., input /G went high, so, at the leading edge of clock pulse 1, since the first term of the A equation was satisfied after /G went high, output A goes high. After A goes high, the first term of the equation is no longer satisfied, but the second term is, so, at the leading edge of the second pulse, A stays high.

With A high, however, the first term of the B equation, which is the same as the second term of the A equation, is satisfied so that a high output is produced by output B at the leading edge of the second clock pulse. Now with B high, neither term of the A equation is satisfied, so the A output goes low at the next clock pulse, i.e. at the leading edge of the third pulse. Also, with both A and B high, the second term of the B equation is satisfied, as is also the first term of the C equation, so that, while the output of A goes low at the leading edge of the third clock pulse, the output of B stays high and the output of C goes high.

With the output of B and C both high, neither term of the B equation is satisfied, but the second term of the C equation is satisfied so that, at the leading edge of the fourth clock pulse, the output of B goes low but the output of C stays high. Now, with only C high, neither term of the C equation is satisfied, but the first term of the D equation is satisfied, i.e. C is high and the other outputs low, so that the leading edge of the fifth clock pulse causes the output of C to go low and the output of D to go high.

With output D high, the second term of the D equation is satisfied as is the first term of the E equation. Therefore, the leading edge of the sixth clock pulse causes the D output to remain high and the E output to go high. With the E output high, neither term of the D equation is satisfied, but the second term of the E equation is satisfied as is the first term of the F equation, so that on the leading edge of the seventh clock pulse, the output of E stays high and the output of F goes high.

With F high, neither term of the E equation is satisfied, but with both E and F high, the second term of the F equation is satisfied so that the leading edge of the eighth pulse causes the output of E to go low but F to stay high. Now with E low, neither term of the F equation is satisfied so the output of F goes low at the leading edge of the ninth clock pulse. During the ninth clock pulse there is no output except for the /G output, which satisfies the first term of the A equation so that the leading edge of the tenth clock pulse starts the sequence over again.

If the "off" switch is pushed at any time, the next clock pulse will cause the /G output to go low and the next clock pulse will cause all other outputs to stop since the /G output has to be high for any of the terms of the A, B, C, D, E, or F equations to be satisfied.

The equation given for G defines the on-off operation as explained above. The last line of each of the equations as well as the last line in the listing of equations are provided in programming a TTL prototype (PAL1-6RA8 below) of the ZHAL to ensure continued operation of the clock. The items in the right hand column are merely comments and do not affect operation of the program. These merely relate the program terms to the operation of the groups of LEDs in the Disneyland display as previously described. While the specific circuitry described uses a ZHAL device for IC1 and such is preferred because of its low quiescent operating current, a similar programmed array logic (PAL) device such as a PAL16RA8 made by Monolithic Memories could be used and would be programmed in identical manner. In fact, the PAL device is usually programmed initially and the circuitry tested to ensure proper operation before the ZHAL devices are manufactured. With the above equations and explanation, any person skilled in the art of programming a PAL device should be able to set up the circuitry to operate as described.

Each of the outputs of IC1 are connected to an input of the driving circuitry, IC2. Thus, output A of IC1 is connected to input 8 of IC2. A high signal on input 1 of IC2 causes output terminal 11 of IC2 to become grounded, thereby completing the circuit from +Vcc through LED1 and current limiting resistor R5 to ground and causing LED1 to light. While LED1 is shown as a single LED, it represents any desired number of LEDs connected in parallel, so that all light together. With the Disneyland design shown, LED1 represents the first group of LEDs described, i.e. the sixteen individual LEDs which form the center portion of the fireworks display in the design.

The output B of IC1 is connected directly to input 7 of IC2 so that the high output of B on input 7 causes output 12 of IC2 to become grounded and the circuit from +Vcc through LED2 and current limiting resitor R6 to be closed to thereby illuminate LED2. As with LED1, LED2 represents a number of individual LEDs connected in parallel and here represents the thirty-six individual LEDs which form the intermediate portions of the fireworks bursts. In similar manner, outputs C, D, E, and F are connected to inputs 6, 5, 4, and 3 of IC2, respectively, which operate outputs 13, 14, 15, and 16, respectively, of IC2, to connect and cause LED3, LED4, LED5, and LED6, respectively, to illuminate. Resistors R7, R8, R9, and R10 are connected in series with LED3, LED4, LED5, and LED6, as current limiting resistors similar to resistors R2 and R3. Again, LED3, LED4, LED5, and LED6 each represent a number of individual LEDs connected in parallel to make up a group of the LEDs as described above, which are illuminated together to light the design as described. Since the number of LEDs vary with each group, resistors R5–R7 may have different values depending upon the actual number of LEDs in the group. These resistors will generally be set so that the LEDs each draw between 1 and 4 milliamps of current. With the particular LEDs indicated, a dim light is produced with a milliamp and a very bright light is produced with 4 milliamps. Between 2 and 3 milliamps usually provides sufficient illumination for any desired display.

For the circuit shown and described, using a power supply of three volts so that +Vcc is a positive three volts, and using the number of LEDs use in each group described above in describing the sequence of operation for the Disneyland design, the following resistor values have been found satisfactory: R5=82 ohms, R6=36 ohms, R7=10 ohms, R8=10 ohms, R9=82 ohms, and R10=82 ohms. Further, a three Hertz operating frequency for the circuitry has been found satisfactory and such frequency has been set with R1=4 meg ohms, R2=2 meg ohms, C1=0.22 microfarards, and D1 is a 1N3064. The pull up resistors R3 and R4 may each be 10K ohms. Further, with a display as shown and the battery holder as described, it has been found that the circuitry will operate in "on" condition on a continuous basis for about eight hours.

It should be realized that the Disneyland design and the specific arrangement of LEDs and sequence of operation are merely given as an example of a display that may be made according to the invention and that numerous other designs, themes for designs, arrangements of LEDs, and sequence of operation of LEDs may be used.

Figure 10:
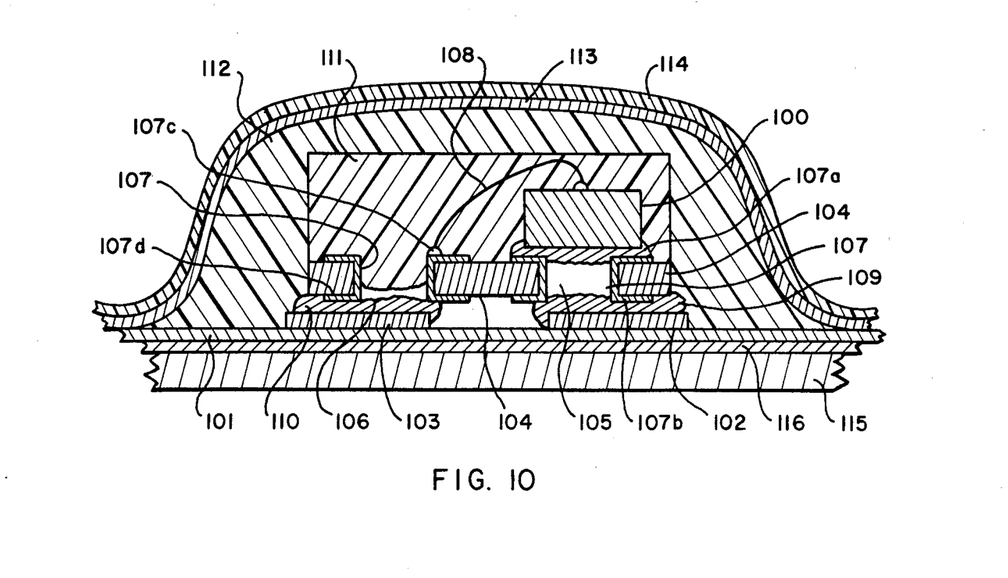
FIG. 10, a fragmentary vertical section similar to that of FIG. 2, but showing an alternate embodiment of mounting structure for the LED die.

Rather than assembling the display by placing individual LED dies directly on the circuit board, in some instances it may be advantageous to mount the LED dies on a substrate before mounting them on the circuit board. FIG. 10 shows such an alternate embodiment for mounting a die 100 on a circuit board similar to board 10 with a mylar sheet 101, copper die mounting pad 102 and opposite polarity copper trace 103. In this embodiment, however, a substrate 104 is provided, which may be a small additional printed circuit board of a size such as 0.05×0.025 inches. Because this board is very small, it may be a rigid board rather than a flexible board. The board 104 has holes 105 and 106 drilled therethrough and has an electrically conductive material 107 plated through the holes and extending to pads 107a, 107b, 107c, and 107d on opposite surfaces of the board. In this embodiment, the LED die 100 is mounted using conductive epoxy on board 104 over pad 107a. Wire 108 is bonded in normal manner, such as by conventional gold ball bonding techniques, to the top of die 100 and to conductive pad 107c. In this manner, an LED die assembly is formed as a separate unit and then bonded to the display circuit board 101 by conductive epoxy 109, which bonds the small board 104 and conductive pad 107b to conductive pad 102, and by conductive epoxy 110, which bonds the board 104 and conductive pad 107d to conductive trace 103. When producing the LED die on the substrate, it is preferred that a substrate be prepared with a number of LED dies mounted thereon and wire bonded as described. The LED dies are then encapsulated on the substrate with encapsulating material 111. At this point, the large substrate is cut into the individual small substrate pieces described, each having an individual LED die thereon. The LED die is encapsulated by material 111 at the time the unit is mounted on the display circuit board. However, when the epoxy mounting the substrate assembly to the display circuit board sets, it is preferred that the whole assembly be encapsulated with encapsulating material 112, which protects the assembly and further secures it to the mylar display circuit board 101. The display may then be covered with adhesive layer 113 and covering material 114 and secured to a shirt 115 with adhesive 116, as explained above for FIG. 2.

The reason this alternate embodiment of the invention might be used is that current aluminum wedge bonding and gold ball bonding equipment, as previously indicated, is more adapted to relatively small items with closely spaced components and can more easily connect a large number of closely spaced LED dies to the substrate terminals on a small substrate that it can connect widely spaced LED dies over the area of a large display. With the assembled LED dies on the small substrate, conductive epoxy may be placed where it is desired to secure the LEDs, and the substrate, with LED already mounted, merely needs to be placed on the epoxy by the pick and place equipment. Wire bonding at various locations spaced over the surface of the large display is not required.

The display of the invention can be used in various ways and may be supplied in various forms. For example, when used for tee-shirts or other items of clothing, the display may be applied to the article of clothing at a central location and then the clothing with display thereon distributed to various outlets, or the display, apart from the article of clothing, may be distributed to various outlets, which then apply them to the clothing using the heat press described.

Further, the overall design could be supplied in multiple parts, so that a generic football design and display could be provided and the display could be individualized for a particular team by adding the team name or logo as a separate item to the generic design.

While the covering material has been described as having transparent or translucent areas, which cover the encapsulated LEDs and allow light from the LEDs to pass therethrough, the protective layer could have holes therethrough through which the encapsulated LEDs would extend and to which the protective layer would be sealingly secured.

Also, while the control circuitry has been shown as attached to the display board and sealed by the covering material, the control circuitry could be provided in a separate unit or with the battery pack and be connected to the display board with wires.

Whereas this invention is here illustrated and described with specific reference to embodiments thereof presently contemplated as the best mode of carrying out such invention in actual practice, it is to be understood that various changes may be made in adapting the invention to different embodiments without departing from the boarder inventive concepts disclosed herein and comprehended by the claims that follow.

I claim:

1. A flexible LED display comprising flexible circuit board means having a plurality of electrical conductive paths thereon; a plurality of individual LED dies secured to said circuit board means in predetermined positions to mate with a desired design; means electrically connecting said individual LED dies to appropriate conducting paths of said circuit board; material encapsulating each individual LED die to provide physical protection for the die and act as a lens for light emitted from the die; electronic control circuit means electrically connected to the conductive paths on said circuit board for supplying power to selected conductive paths to thereby illuminate selected LEDs; means adapted to be connected to a power supply for supplying power to the control circuit means; and design means substantially covering the board and having respective predetermined areas aligned with respective LED dies on the board through which light can pass when an aligned LED is illuminated.

2. An LED display according to claim 1, wherein the design means is a covering material with design thereon bonded to the face of the circuit board means to thereby cover and waterproof said circuit board means.

3. An LED display according to claim 2, wherein the covering material also covers each individually encapsulated LED die.

4. An LED display according to claim 3, wherein the covering material is transparent where it covers an individually encapsulated LED die.

5. An LED display according to claim 3, wherein the covering material is translucent where it covers an individually encapsulated LED die.

6. An LED display according to claim 1, wherein the electronic control means supplies driving power to selected conductive paths in a predetermined sequence.

7. An LED display according to claim 1, wherein individual LED die are secured directly to the circuit board.

8. An LED display according to claim 7, wherein the encapsulating means also encapsulates the means electrically connecting the LED die to the conductive paths.

9. An LED display according to claim 7, wherein each individual LED die is secured directly to an electrical conductive path on the circuit board by a conductive adhesive.

10. An LED display acccording to claim 1, wherein individual LED dies are each mounted on a individual substrate which, in turn, is mounted on the circuit board means.

11. An LED display according to claim 10, wherein the means encapsulating each individual die encapsulates each individual die as mounted on the substrate.

12. An LED display according to claim 11, wherein additional encapsulating material encapsulates the LED die and substrate as mounted on the circuit board means.

13. An LED display according to claim 10, wherein an individual LED die is mounted on the circuit board means by securing the substrate directly to selected electrical conductive paths on the circuit board by conductive adhesive.

14. An LED display according to claim 1, wherein there is additionally included a covering material bonded to the face of the circuit board means to thereby cover and waterproof said circuit board means.

15. An LED display according to claim 1, wherein the electronic control circuit includes a programmable array logic device and wherein said device is connected to form an internal clock, eliminating the need to have a separate clock circuit.

16. An LED display according to claim 1, wherein the electronic control circuit includes a programmable array logic device, wherein said device is connected to selectively operate in an "on" mode wherein power is selectively supplied to the conductive paths or an "off"

mode wherein no power is supplied to the conductive paths and wherein membrane switches are provided to cause the device to switch between the "on" or the "off" modes.

17. An LED display according to claim 2, wherein the display is bonded to an item of clothing.

18. An LED display according to claim 17, wherein the means adapted to be connected to a power supply includes male and female snap members extending from connection to the display through the item of clothing so as to be exposed on an inside surface of the item of clothing where they are adapated to mate with mating snap members electrically connected to a power supply.

19. A flexible LED display comprising flexible circuit board means having a plurality of electrical conductive paths thereon; a plurality of individual LED dies secured to said circuit board means; means electrically connecting said individual LED dies to appropriate conducting paths of said circuit board; material encapsulating each individual LED die to provide physical protection for the die and act as a a lens for light emitted from the die; electronic control circuit means electrically connected to the conductive paths on said circuit board for supplying power to selected conductive paths to thereby illuminate selected LEDs; a covering material bonded to the face of the circuit board means to thereby cover and waterproof said circuit board means; and means adapted to be connected to a power supply for supplying power to the control circuit means.

* * * * *